US006815259B2

(12) United States Patent
Ninomiya et al.

(10) Patent No.: US 6,815,259 B2
(45) Date of Patent: Nov. 9, 2004

(54) METHOD OF SUPPORTING A FLEXIBLE SUBSTRATE AND METHOD OF MANUFACTURING A SEMICONDUCTOR DEVICE

(75) Inventors: Hideaki Ninomiya, Chuo-ku (JP); Hisao Morooka, Chuo-ku (JP); Yoshihito Yamamoto, Chuo-ku (JP); Kazuo Nishi, Atsugi (JP)

(73) Assignees: Semiconductor Energy Laboratory Co., Ltd., Kanagawa-ken (JP); TDK Corporation, Tokyo (JP)

( * ) Notice: Subject to any disclaimer, the term of this patent is extended or adjusted under 35 U.S.C. 154(b) by 0 days.

(21) Appl. No.: 09/931,717

(22) Filed: Aug. 20, 2001

(65) Prior Publication Data

US 2002/0037605 A1 Mar. 28, 2002

(30) Foreign Application Priority Data

Sep. 25, 2000 (JP) ............................ 2000-290558

(51) Int. Cl.$^7$ ............................................. H01L 21/50
(52) U.S. Cl. ............................................................ 438/125
(58) Field of Search ............................. 438/125, 457; 242/358; 40/701; 29/825, 832, 840, 841, 846

(56) References Cited

U.S. PATENT DOCUMENTS

| | | | |
|---|---|---|---|
| 4,231,847 A | | 11/1980 | Lui |
| 4,612,409 A | | 9/1986 | Hamakawa et al. |
| 4,773,942 A | | 9/1988 | Hamakawa et al. |
| 4,875,943 A | | 10/1989 | Hamakawa et al. |
| 4,915,894 A | * | 4/1990 | Mitsui et al. ............... 264/212 |
| 5,127,964 A | | 7/1992 | Hamakawa et al. |
| 5,192,991 A | * | 3/1993 | Hosokawa ................... 257/51 |
| 5,331,183 A | | 7/1994 | Sariciftci et al. |
| 5,419,781 A | | 5/1995 | Hamakawa et al. |
| 5,454,880 A | | 10/1995 | Sariciftci et al. |
| 5,538,902 A | | 7/1996 | Izu et al. |
| 5,561,321 A | * | 10/1996 | Hirano et al. ................ 257/700 |
| 5,626,686 A | | 5/1997 | Yoshida |
| 5,650,809 A | * | 7/1997 | Kitamura ...................... 347/55 |
| 5,733,381 A | | 3/1998 | Ota et al. |
| 5,848,465 A | * | 12/1998 | Hino et al. .................... 29/825 |
| 6,028,351 A | * | 2/2000 | Klonis et al. ................ 257/680 |
| 6,040,520 A | | 3/2000 | Morooka et al. |
| 6,074,893 A | * | 6/2000 | Nakata et al. ............... 438/106 |
| 6,111,324 A | * | 8/2000 | Sheppard et al. ............ 257/787 |
| 6,210,872 B1 | * | 4/2001 | Hosaki et al. ............... 430/631 |
| 6,350,549 B1 | * | 2/2002 | Sakurai et al. ................ 430/51 |
| 6,533,968 B1 | * | 3/2003 | Feist et al. .................. 264/1.33 |

FOREIGN PATENT DOCUMENTS

JP          05-308855         11/1993

OTHER PUBLICATIONS

Smithsonian Physical Tables, prepared by William Elmer Forsythe, Ninth Revised Edition, p. 149, 2003 (first published in 1954).*

* cited by examiner

Primary Examiner—Evan Pert
Assistant Examiner—Scott B. Geyer
(74) Attorney, Agent, or Firm—Eric J. Robinson; Robinson Intellectual Property Law Office, P.C.

(57) ABSTRACT

A frame-shaped holding frame which has a small thermal expansion coefficient is used. When a complex member in which a metal material is impregnated in a ceramic material, which has a smaller thermal expansion coefficient than 10 ppm/° C., is used, a warp and a wrinkle are greatly decreased. In particular, in the case of a material with a thermal expansion coefficient of 6.5 ppm/° C. or smaller, the warp and the wrinkle are not caused. When the flexible substrate is adhered to the holding frame by an adhesive, an adhesion area may be obtained so that a sufficient strength is kept. Also, since the flexible substrate is adhered onto the upper surface of the holding frame, the thickness of the holding frame is independent on fixing of the substrate. The thickness may be set so that a mechanical strength is kept and the substrate is smoothly transferred.

30 Claims, 6 Drawing Sheets

METHOD OF SUPPORTING A FLEXIBLE SUBSTRATE AND METHOD OF MANUFACTURING A SEMICONDUCTOR DEVICE

BACKGROUND OF THE INVENTION

1. Field of the Invention

The present invention relates to a method of supporting a flexible substrate such as a plastic film, in particular, to a treatment method including a transfer facility and an alignemnt, which is allowed by fixing a flexible substrate with a sheet form into a frame with rigidity. Also, the present invention relates to a method of fixing a flexible substrate into a holding frame and depositing a non-single crystalline semiconductor film on the flexible substrate to manufacture a semiconductor device.

2. Related Background Art

Recently, with respect to a semiconductor device manufactured using a semiconductor film, various substrate materials are used. Thus, electronic device products in which a non-single crystalline silicon thin film is formed on not only a substrate made of a single crystalline silicon material but also an insulating substrate or the like have been progressed. The non-single crystalline silicon has visual light absorption characteristics superior to the single crystalline silicon, and thus a solar battery using a thin film of the non-single crystalline silicon can be formed. Further, a thin film transistor non-single crystalline silicon formed on a light transmitting and insulating substrate such as a glass substrate is generally applied as an active element of a liquid crystal display device. With respect to an electronic device using a thin film semiconductor, a low manufacturing cost and high processing flexibility are also the characteristics. Note that, here, the non-single crystalline silicon indicates amorphous silicon, microcrystalline silicon, thin film polycrystalline silicon or a mixture of those.

In particular, a thin film solar battery manufactured by forming a non-single crystalline silicon film on a flexible substrate such as a plastic film is greatly noted. Since such a solar battery is a thin type, light weight, flexible, and the like, that is, has characteristics that a solar battery manufactured using a glass substrate does not have, its application is expanded to a novel product field.

However, it is very difficult to treat the plastic film. A hard substrate such as a glass substrate has rigidity and a small thermal expansion coefficient. Therefore, a shrinkage and a warp due to a heat cycle in a manufacturing process of a non-single crystalline silicon solar battery manufactured at a relatively low temperature are extremely slight, and thus there is particularly no problem in the process. The glass substrate can be independently supported by its mechanical strength and thus automation of an apparatus can be easily designed. However, the plastic film substrate is curved and deformed due to the heat cycle in the manufacturing process, as shown in FIGS. 1A, 1B, and 1C, and further there is the case where the deformation of the substrate is promoted due to an internal stress of a film to be formed. In particular, when the plastic film substrate is formed with a sheet form, such a thin plastic film substrate has flexibility and thus it is difficult to independently support the substrate. Therefore, the automation of the manufacturing process is delayed.

When the non-single crystalline silicon is formed in the sheet-shaped plastic film substrate by a general load lock plasma CVD apparatus, in order to prevent the curvature and the deformation due to heating and the internal stress of the film described above, it is essential to prefix the substrate by a jig and carry it. Also, since the film substrate itself does not have almost weight and rigidity, it is essential to prefix the substrate by the jig and carry it. As shown in FIG. 2A, the film fixing jig is constructed by a metal plate 204 made of aluminum, stainless, or the like and a frame (or a frame type) 201 made of the same metal as the metal plate 204, which are overlapped with each other in the vertical direction. As shown in FIG. 2B, the film substrate is fixed by screw cramp, or sandwiching using a clip or the like. In the case of such a fixing method, the following problems are given. That is, the fixing operation is complicated. Further, since only ends of the film substrate are partially fixed and a force for fixing the film substrate is not uniformed, as shown in FIG. 3, a warp and a wrinkle 305 are easy to occur in the entire film substrate. Also, since the metal fixing jig itself is expanded during heating, there is the case where the warp and the wrinkle are promoted and the case where in-plane thermal uniformity of the film substrate is reduced and a film thickness and film quality of the non-single crystalline silicon to be formed are not uniformed. Also, as described above, since the film substrate is fixed by sandwiching, a step is caused between the surface of the film substrate and the fixing frame. Therefore, since plasma is not uniformly spread at the film formation, a film thickness and film quality in the ends of the film substrate are not easily uniformed. This causes a reduction in a product yield. Also, even in sputtering, vacuum evaporation, or the like as a film formation process of a transparent conductive film such as a metal electrode or an ITO film, the reduction in yield is caused by the same harmful influence.

In the manufacturing process of the thin film solar battery using the plastic film substrate, a laser processing process for performing element isolation and dividing solar batteries into a predetermined shape and a printing process for performing insulating processing, electrode formation, and the like are widely used in addition to the film formation process. In the laser processing process as the former, the structure is such that laser light condensed by an optical system is focused onto the surface of an object to be processed. Then, a stage is scanned at a predetermined energy density along a preset path to perform processing. Therefore, if the surface to be processed is not smooth and a level is not kept, there is the case where an energy density on the surface to be irradiated is changed and thus a processing failure is caused within the surface to be scanned. In order to prevent such a processing failure, generally, vacuum suction is performed for leveling the film substrate. This vacuum suction is an effective means in the case of a general film substrate leveling as shown in FIG. 4A. However, there is the case where the film substrate itself is warped and deformed due to the film stress as described above and thus the vacuum suction failure is caused as shown in FIG. 4B. Further, the laser processing is a means for micro-processing a plurality of product patterns using as a standard a point (hereinafter referred to as a marker) which is provided in advance within the surface of the film substrate. However, in the case of an operation for setting the film substrate on a vacuum suction stage, even when the alignment by fixing the ends of the film substrate is performed, it is cannot be prevented that the marker becomes an arbitrary position. Therefore, it is necessary to optically detect the position of the marker and finely actuate the stage every sheet, and thus to initialize a processing start position.

On the other hand, the printing process is performed plural times for insulating processing, integration, formation of both surface electrodes, and the like before and after the laser processing process. As a printing method, a screen printing technique is generally used. According to this technique, a resin as an object is applied to a screen stencil in which a pattern is formed, and then the inner surface of the screen stencil is pressured and moved by using a spatula-shaped rubber plate that is called a squeegee. Thus, press printing is performed for the surface of an object to be printed, which is located under the stencil. In the case of this printing process, if the surface of the film substrate is not smooth and a level is not kept for the screen stencil, the pattern cannot be accurately printed. Therefore, similarly to the laser processing, the vacuum suction is performed for fixing the film substrate. As described above, even in this vacuum suction, there is the case where the film substrate in which the non-single crystalline silicon and the like are formed is warped and deformed and thus suction failure is caused. Also, the marker used for being overlapped with a minute printing pattern or a laser processing position is located in an arbitrary position every set operation of one sheet. Thus, it is necessary to automatically and optically detect the position of the marker and finely move the stage every sheet to perform the alignment. This causes an increase in cost of the semiconductor device.

As the resin used in the printing process, a thermosetting resin is mainly used regardless of an insulating resin or a conductive resin. After the printing pattern is formed and a predetermined leveling period is elapsed, the resin is cured and dried at a temperature of 150° C. to 200° C. Even in this case, it is easy to warp the sheet-shaped film substrate due to thermal deformation. Therefore, the film substrate is fixed onto a metal plate made of aluminum or the like by a clip or the like and thus the deformation of the film substrate is prevented. Also, by using the same method, a storage of the film substrate into a substrate cassette is allowed and working efficiency of a furnace is improved. However, as a matter of course, in this process, the ratio of the manual work is high, the throughput is decreased, and the automation is delayed.

With respect to a solar battery in which a sheet-shaped outer appearance for making a plurality of items is obtained, after a selection operation typified by a current-voltage characteristic (I-V characteristic) measurement and a reliability test, the solar battery is finally divided into the respective items to obtain a single product individually. In this process as well, the marker is used and then a process is progressed by an alignment using an optical and automatic detection method. A usage of the marker is not limited to the solar battery. With respect to almost semiconductor electronic devices, the alignment using the marker is used as a most effective means for laminating minute patterns by a photolithography process. Since the speed of an automatic alignment mechanism, in which an optical system detector and a stage actuating apparatus are linked with each other, which are used here, is increased, there is almost no influence on the throughput. However, there is a demerit that an apparatus cost is increased. As a matter of course, in the case of the printing process of the solar battery manufacturing process, there is the same demerit.

As a problem common to all processes, there is a problem that the direction of the sheet is not determined. In the semiconductor manufacturing process using a single crystalline silicon wafer, an orientation flat or a cut portion called a notch, indicating the surface direction of silicon crystal, is formed. Thus, in addition to an improvement of recognition, an alignment for a pattern formation, centering of a substrate, and a direction of processing in an apparatus, are determined. Therefore, when the direction of the processing is kept constant, repeatability of the manufacturing process can be improved. Further, when a defective is caused, its analysis is made easy. However, the sheet-shaped film substrate is symmetric with respect to up and down directions or right and left directions. Of course, when the film substrate is cut from a roll, for example, its corner is cut to make the film substrate asymmetric and thus the sheet is allowed to have the direction. However, there is a harmful influence that the number of processes is increased and further the number of products from a substrate is decreased.

SUMMARY OF THE INVENTION

According to the present invention, in the case where a flexible substrate which is wound with a roll in an initial state is cut from the roll to make a sheet-shaped substrate, problems with respect to a treatment in processes and deformation of the substrate, are solved. In addition, problems with respect to a transfer method in a facility and a position of a product formed on the substrate are solved.

The structure of the present invention will be described. First, a holding frame with a frame shape as shown in FIG. 5A is prepared. The holding frame is made of ceramics-metal complex with a small thermal expansion coefficient. Note that the material is not limited to the ceramics-metal complex. Thus, if the thermal expansion coefficient is small, metal, alloy, ceramics, glass, or a material in which these are bonded together may be used. A complex member in which a metal material is impregnated in a ceramic material has particularly a small thermal expansion coefficient and thus the substrate is not almost deformed due to the thermal expansion during the process. Therefore, it is desirable that such a member is used. Actually, a plastic film substrate is adhered to the holding frame which has a thermal expansion coefficient of 10 to 20 ppm/° C. or larger and is made of stainless and aluminum, and then heated. As a result, a warp and a wrinkle are caused in the surface of the film substrate. However, when the ceramics-metal complex having a smaller thermal expansion coefficient than 10 ppm/° C. is used, the warp and the wrinkle are greatly decreased. In particular, in the case of a material having a thermal expansion coefficient of 6.5 ppm/° C. or less, the warp and the wrinkle are not caused.

As shown in FIG. 5B, the holding frame is constructed so that the inner size is smaller than the outer size of a flexible substrate as an object and the outer size is larger than the outer size of the flexible substrate. The width of the frame is not limited to a specific length. When the flexible substrate is adhered to the holding frame by an adhesive, an adhesion area may be obtained so that a sufficient strength is kept. Also, since the flexible substrate is adhered onto the upper surface of the holding frame, the thickness of the holding frame is independent on fixing of the substrate. Thus, the thickness may be set so that a mechanical strength is kept and the substrate is smoothly transferred.

As shown in FIGS. 5A and 5B, a C-plane processing indicated by reference numeral 502 is carried out to the outer shape of the holding frame in order to provide the sheet with the direction. Therefore, recognition with respect to the treatment of the sheet is improved and the direction of the processing is kept constant. Thus, the reproducibility of the manufacturing process can be improved. Also, the C-plane detection sensor is provided with an apparatus, an error of an entering direction into the apparatus can be detected.

In order to adhere the flexible substrate to the upper surface of the holding frame, an adhesive, in which a mechanical strength is not largely decreased under a high temperature and an amount of degas under a vacuum is extremely less, is used. When such an adhesive is used, even in an apparatus such as a plasma CVD apparatus which a high temperature state requires under a vacuum, a semiconductor film with a high purity can be formed without causing contamination due to the degas from the adhesive. Actually, a temperature for forming a non-single crystalline silicon film with a good quality is one hundred and several tens degrees. Thus, when the structure in which the holding frame is not directly heated is used as a heating mechanism, a heat resisting temperature of the adhesive may be 100° C. or higher.

With respect to the flexible substrate adhered to the holding frame by the adhesive, for example, a plastic film substrate, a warp is slightly caused immediately after adhering. However, the film substrate is shrunk by heating and then, as shown in FIG. 6A, a tension is uniformly applied toward the frame in directions of arrows indicated by reference numeral 605. Thus, a flat surface can be formed as a sliding-screen paper fitted to a wooden frame. The plastic film used in the present invention can be made of polyethylene naphthalate, polyethylene terephthalate, polyether sulfon, polyimide, or the like. Here, it is important to fix the entire circumference of the plastic substrate to the holding frame by the adhesive. If a portion of the plastic substrate is not adhered to the holding frame, the wrinkle and the warp due to the shrinkage are concentrated on the portion and thus leveling is suppressed. An amount of shrinkage for obtaining a flat surface is desirably in a range of 0.2 to 2.0%. With respect to a material with a larger shrinkage ratio than this range, the substrate and the holding frame may be integrally formed after carried out shrinkage by preheating. In the case of the plastic film substrate, a heating temperature required for causing the shrinkage within the above range may be 100 to 200° C. This temperature is equal to a heating temperature in a plasma CVD apparatus and the like. Thus, leveling of the film substrate adhered to the holding frame can be carried out without adding a specific process. The present invention is realized by integrally forming the holding frame with a small thermal expansion coefficient and the flexible substrate with heat shrinkage. The leveling, the most ideal shape control effect, is one of typical characteristics of the present invention.

By the leveling effect obtained by integrally forming the holding frame and the plastic film substrate, thermal uniformity in the apparatus which requires vacuum heating can be improved and in-plane variations of the film quality and the film thickness can be decreased. Also, the instability of plasma by a step is not caused in the surface of the film substrate which can keep a flat surface on the upper surface of the holding frame, and thus, the uniformity of the film is similarly improved. Further, the vacuum suction failures as the problems in the laser processing process and the printing process are completely suppressed and an accurate flat surface can be kept without using the vacuum suction. Since a step is not formed on the surface of the film substrate, a screen printing can be carried out with a state in which the substrate and the frame are integrally formed.

Until now, the alignment is performed using the marker formed on the substrate. However, according to the present invention, the sheet can be set to a processing stage or the like using the inner shape and the outer shape of the holding frame as a standard. Also, in the stage aligned in advance, it is not necessary to optically perform a marker detection operation and an alignment for finely actuating the stage every sheet. Further, a tact time can be shortened and an apparatus cost can be greatly reduced.

When the holding frame and the sheet substrate are integrally formed, the processes from a start process such as washing and film formation until a final process such as product dividing can be continued with the same configuration without performing attachment and detachment of a sheet fixing jig, which are performed every process until now. Thus, the number of operation processes can be reduced. Also, an automatic transfer to all apparatuses can be performed and a substrate cassette with the outer size of the holding frame as a standard can be shared among apparatuses. Therefore, the automation through all processes can be realized.

DETAILED DESCRIPTION OF THE PREFERRED EMBODIMENTS

Figure 1A:
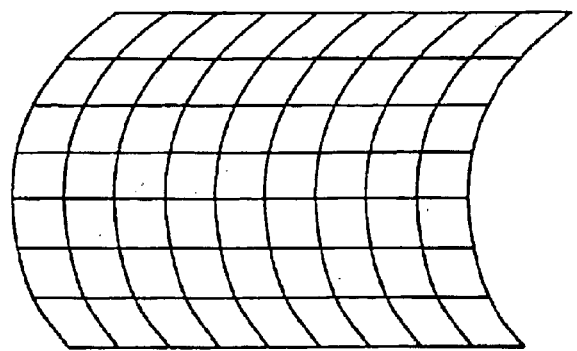
FIGS. 1A to 1C show warp shapes of a flexible sheet substrate.
Figure 1B:
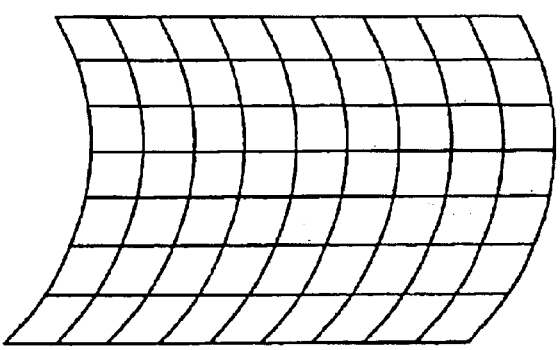
Figure 1C:
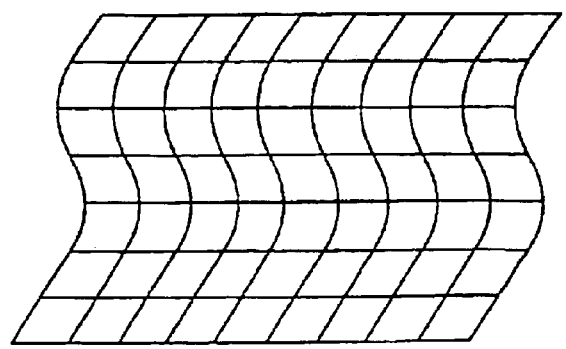
Figure 2A:
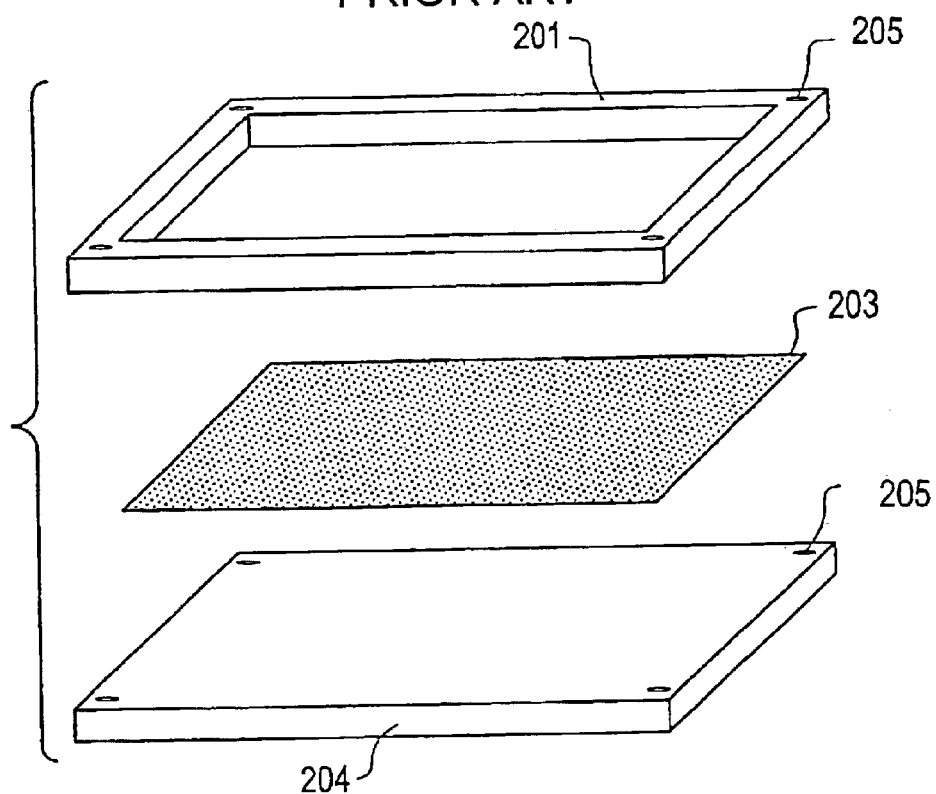
FIGS. 2A and 2B show a conventional film fixing jig.
Figure 2B:
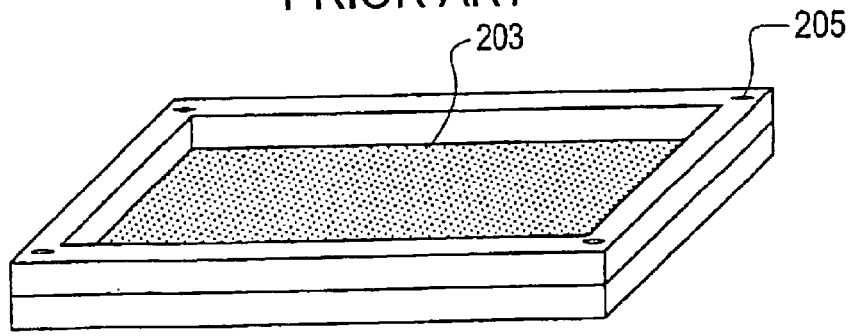
Figure 3:
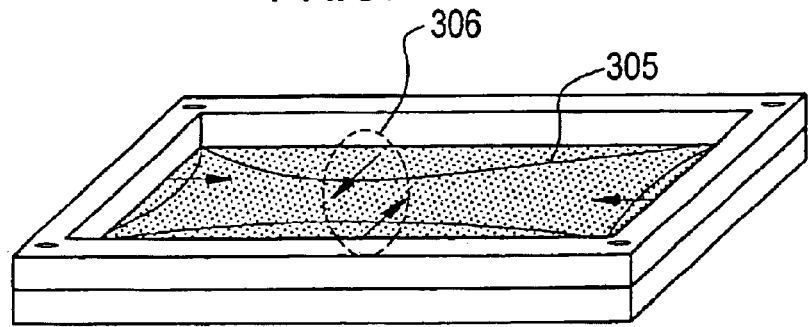
FIG. 3 shows a warp and a wrinkle, which are caused in a film substrate.
Figure 4A:
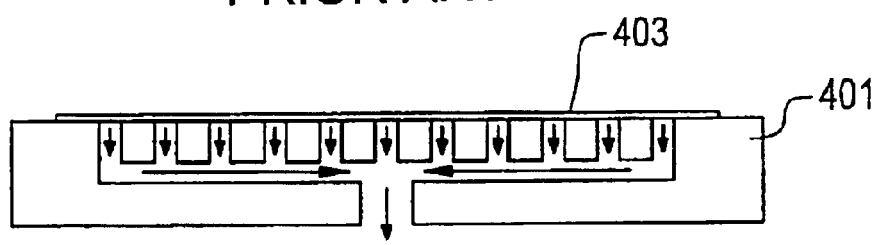
FIGS. 4A and 4B are cross sectional views showing the case where vacuum suction is made for the film substrate.
Figure 4B:
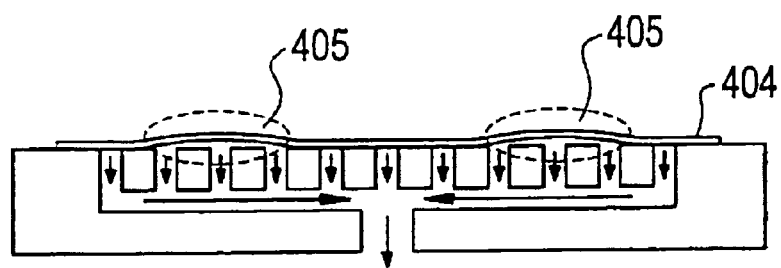
Figure 5A:
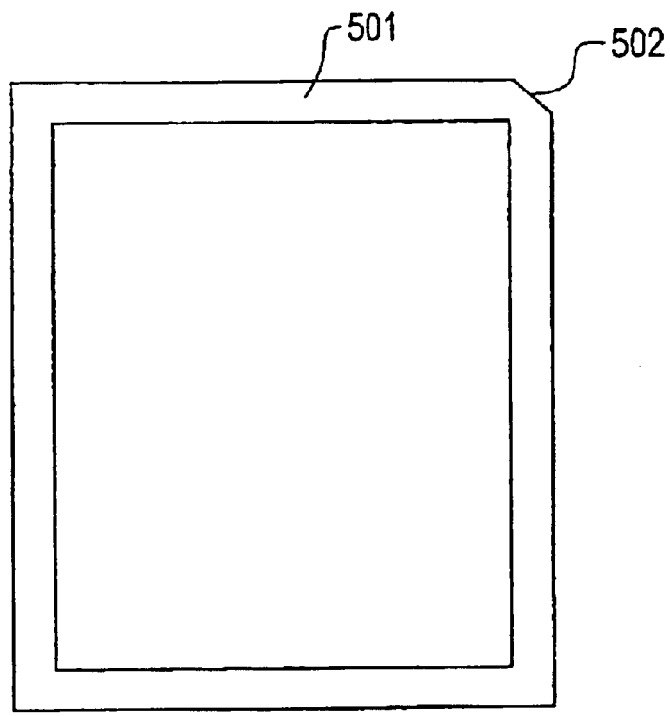
FIGS. 5A and 5B show a shape of a holding frame and a state that the film substrate and the holding frame are integrally formed, respectively.
Figure 5B:
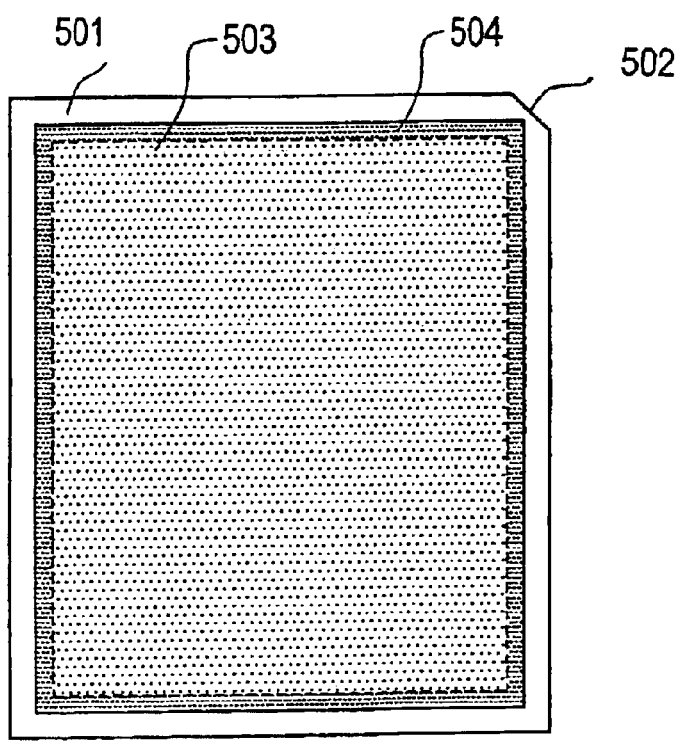

A process for manufacturing a solar battery as an embodiment of the present invention will be described. First, a frame-shaped holding frame shown in FIG. 5A, which has a small thermal expansion coefficient and is made of ceramics-metal complex, is prepared. The material is an SiC—Al system complex MMC PAL70 produced by Celanx k.k. and the thermal expansion coefficient is 6.2 ppm/° C. An outer size of the frame is 225 mm×350 mm, a frame width is 10 mm, and a thickness is 3 mm. Also, in order to provide processing of the substrate with the direction through all processes, a C-plane processing indicated by reference numeral 502 in FIG. 5A is performed for one of corners in the outer shape of the holding frame to be used for alignemnt and detection. As a flexible substrate indicated by reference numeral 503 in FIG. 5B, a light transmitting and insulating polyethylene naphthalate film (hereinafter referred to as a PEN film) is used.

In an initial state, the PEN film substrate is wound with a long sheet in a roll shape. First, in order to form an lower electrode, aluminum and stainless are formed by a roll-to-roll sputtering apparatus. Next, for single wafer processing in subsequent processes, the film substrate is divided into a predetermined size of 220 mm×345 mm. The rear surface of the divided PEN film sheet is adhered to the upper surface of the holding frame through an adhesion surface (margin left for applying the adhesive) indicated by reference numeral 504 in FIG. 5B using an adhesive. The adhesive used here is a heat resistive both-faced adhesive tape No. 5915 produced by Nitto Denzai Corp. In this embodiment, a metal electrode made of aluminum and stainless is formed by the roll to roll sputtering apparatus before dividing of the PEN film. However, the metal electrode may be formed as a single wafer processing after integrally forming the divided film sheet and the holding frame.

Figure 6:
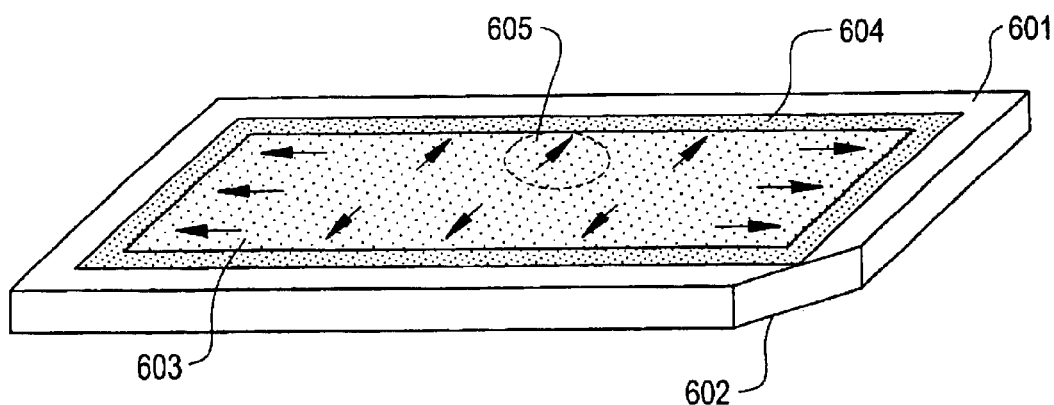
FIG. 6 shows directions of a tension in the film substrate.

Next, after ultrasound washing is performed for the film sheet substrate which is integrally formed with the holding frame (hereinafter referred to as a integrally formed sheet substrate), non-single crystalline silicon thin films having respective conductivity types of P, I, and N are formed thereon by a single wafer processing plasma CVD apparatus. The total film thickness of the laminated non-single crystalline silicon thin films is 300 to 800 nm. In this embodiment, the thickness is set to be 600 nm. Immediately after adhering by the adhesive, a slight warp is caused on the film surface. However, the film formation temperature is 200° C., and thermal shrinkage of 0.3 to 0.5% is caused in the PEN film at this temperature. Thus, the tension indicated by the arrows of reference numeral 605 in FIG. 6 is produced. Therefore, after the film formation, a warp and a wrinkle are not recognized and thus a uniform level surface can be obtained over the entire surface of the integrally formed sheet substrate. As a result, since the thermal uniformity is improved and the spread of plasma becomes stable, the good uniformity with a deviation of ±2% or less can be obtained inside the holding frame of the integrally formed sheet substrate with respect to the film thickness of the formed non-single crystalline silicon thin film. Note that, the integrally formed sheet substrate is loaded to and unloaded from the plasma CVD apparatus by a transfer apparatus with a single wafer processing. Thus, a subsequent process can be performed without attachment and detachment of the fixing jig as described above.

Next, screen printing as primary printing is performed using an insulating resin for providing laser processing with the selectivity. The shape of a stage for fixing an object to be printed is smaller than the inner shape of the holding frame and geometrically similar. Thus, the integrally formed sheet substrate can be screen-printed as it is. The integrally formed sheet substrate stored in a cassette is set on the stage from the cassette by the transfer apparatus every substrate and returned to the cassette after the printing processing. Although a vacuum suction mechanism is provided with the stage, the printing can be also performed with high precision without using the vacuum suction mechanism since a level surface is obtained with high precision on the film surface of the integrally formed sheet substrate. Hereinafter, although the printing process is intermittently performed until the product is completed, the processing can be performed with the same effect as the primary printing. In a secondary printing and the subsequent printing, the alignment is required. However, when the inner and outer shapes of the holding frame are used as a standard, the alignment can be performed without the marker readout.

After the completion of the primary printing, a transparent conductive film is formed. Here, ITO is formed by sputtering. A single wafer processing apparatus is used and the integrally formed sheet substrates stored in a common cassette are loaded in succession into the single wafer processing apparatus by the transfer apparatus. After the completion of the film formation, the substrates are transferred to the cassette. Conventionally, before and after the film formation, there is the required operation that the film substrate is attached to and detached from the metal plate made of aluminum, stainless, or the like by using a clip or a tape. According to the present invention, since such an operation is not required, an operation process time is greatly shortened.

Next, laser processing is performed for molding of a product and an element isolation. As described above for the printing apparatus, the shape of a stage for fixing an object to be laser-processed is smaller than the inner shape of the holding frame and geometrically similar. Thus, the integrally formed sheet substrate can be laser-processed as it is. The integrally formed sheet substrate stored in a cassette is set on the stage from the cassette by the transfer apparatus every substrate and returned to the cassette after the laser processing. As the above screen printing, since a level surface is obtained with high precision on the film surface of the integrally formed sheet substrate, the processing can be performed with high precision without using the vacuum suction mechanism. According to the conventional laser processing process, the alignemnt using the marker is required in order to perform local processing of a minute pattern. However, when the inner and outer shapes of the holding frame are used as a standard, the accurate alignment can be performed without the marker readout. Hereinafter, although the laser processing process is intermittently performed until the product is completed, the processing can be performed with the same effect.

Figure 7:
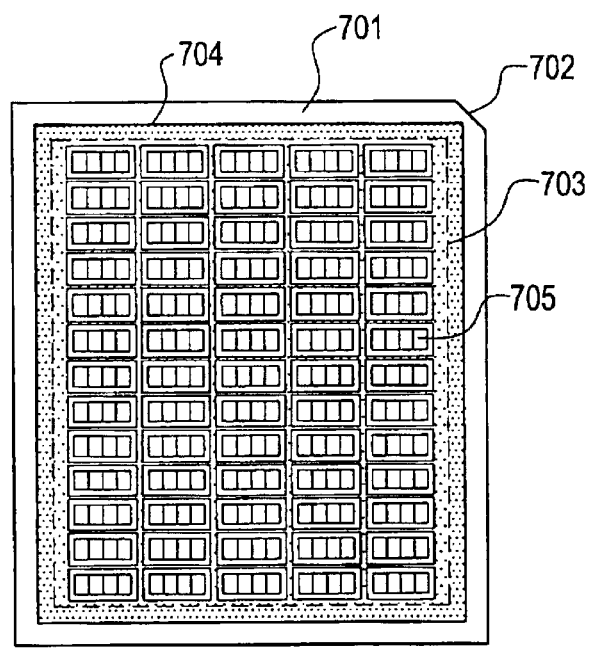
FIG. 7 is an appearance completion view of a sheet in a product.

With respect to a solar battery as shown in FIG. 7, which has a plurality of items obtained on the integrally formed sheet substrate through those processes, the solar battery is finally divided into the respective items along the outer appearance to obtain a single product individually after selection operations such as a current-voltage characteristic (I-V characteristic) measurement and a reliability test. Even in this process, when the inner and outer shapes of the holding frame are used as a standard, the accurate alignment can be performed without the marker readout.

When the holding frame according to the present invention is used, problems with respect to the treatment in processes and the deformation of the substrate can be solved in the case where the flexible substrate wound with the roll in an initial state is cut from the roll to be a sheet-shaped substrate. With respect to the treatment of the flexible substrate according to the present invention, when the flexible substrate is integrally formed with the frame or the like with rigidity through the adhesive, the leveling effect due to the shrinkage of the flexible substrate can be obtained. Also, since the flat surface is kept by the holding frame, a process failure due to the shape factor of the flexible substrate is not caused. Further, an object to be processed is processed with the same configuration from a start process until a final process. Therefore, the substrate storage cassette can be commonly used through all processes and the automation is easily realized. When the inner and outer shapes of the holding frame and the C-plane processing portion are recognized in the apparatus, the detection of the substrate, the addition of the direction, and the alignment are allowed. From the above, according to the present invention, the reduction in the number of processes and the simplification and the automation of the apparatus are allowed. Thus, the present invention can contribute to an improved product yield and a reduced cost.

What is claimed is:

1. A method of manufacturing a semiconductor device, comprising the steps of:

fixing an outer circumference of a flexible substrate capable of being thermally shrunk to a frame-shaped holding frame having a smaller thermal expansion coefficient than 10 ppm/° C.;

heating the fixed flexible substrate at a temperature that the flexible substrate is thermal-shrunk by 0.2% or more; and forming a conductive film on the flexible substrate by a sputtering method.

2. A method of manufacturing a semiconductor device according to claim 1, wherein the flexible substrate comprises one selected from polyethylene naphthalate, polyethylene terephthalate, polyether sulfone, and polyimide.

3. A method of manufacturing a semiconductor device according to claim 1, wherein the holding frame comprises a ceramics-metal complex.

4. A method of manufacturing a semiconductor device according to claim 1, wherein the thermal expansion coefficient is 6.5 ppm/° C. or smaller.

5. A method of manufacturing a semiconductor device, comprising the steps of:

fixing an outer circumference of a flexible substrate capable of being thermally shrunk to a frame-shaped holding frame having a smaller thermal expansion coefficient than 10 ppm/° C.;

heating the fixed flexible substrate at a temperature that the flexible substrate is thermal-shrunk by 0.2% or more; and forming an amorphous semiconductor film on the flexible substrate by a plasma CVD method.

6. A method of manufacturing a semiconductor device according to claim 5, wherein the flexible substrate comprises one selected from polyethylene naphthalate, polyethylene terephthalate, polyether sulfone, and polyimide.

7. A method of manufacturing a semiconductor device according to claim 5, wherein the holding frame comprises a ceramics-metal complex.

8. A method of manufacturing a semiconductor device according to claim 5, wherein the thermal expansion coefficient is 6.5 ppm/° C. or smaller.

9. A method of manufacturing a semiconductor device, comprising:

a first step of fixing an outer circumference of a flexible capable of being thermally shrunk to a frame-shaped holding frame having a smaller thermal expansion coefficient than 10 ppm/° C. and then heating the flexible substrate at a temperature that the flexible substrate is thermal-shrunk by 0.2% or more; and a second step of forming a predetermined pattern over the flexible substrate by screen printing.

10. A method of manufacturing a semiconductor device according to claim 9, wherein a position of the flexible substrate is aligned by an alignment means of the holding frame in the second step.

11. A method of manufacturing a semiconductor device according to claim 9, wherein the flexible substrate comprises one selected from polyethylene naphthalate, polyethylene terephthalate, polyether sulfone, and polyimide.

12. A method of manufacturing a semiconductor device according to claim 9, wherein the thermal expansion coefficient is 6.5 ppm/° C. or smaller.

13. A method of manufacturing a semiconductor device, comprising:

a first step of fixing an outer circumference of a flexible substrate capable of being thermally shrunk to a frame-shaped holding frame having a smaller thermal expansion coefficient than 10 ppm/° C. and then heating the flexible substrate at a temperature that the flexible substrate is thermal-shrunk by 0.2% or more; and a second step of forming a predetermined pattern over the flexible substrate by laser processing.

14. A method of manufacturing a semiconductor device according to claim 13, wherein a position of the flexible substrate is aligned by an alignment means of the holding frame in the second step.

15. A method of manufacturing a semiconductor device according to claim 9, wherein the holding frame comprises a ceramics-metal complex.

16. A method of manufacturing a semiconductor device according to claim 13, wherein the flexible substrate comprises one selected from polyethylene naphthalate, polyethylene terephthalate, polyether sulfone, and polyimide.

17. A method of manufacturing a semiconductor device according to claim 13, wherein the holding frame comprises a ceramics-metal complex.

18. A method of manufacturing a semiconductor device according to claim 13, wherein the thermal expansion coefficient is 6.5 ppm/° C. or smaller.

19. A method of manufacturing a semiconductor device, comprising the step of:

fixing the flexible substrate capable of being thermally shrunk to a holding frame;

heating the fixed flexible substrate at a temperature that the flexible substrate is thermal-shrunk, and forming a conductive film on the flexible substrate by a sputtering method.

20. A method of manufacturing a semiconductor device according to claim 19, wherein the flexible substrate comprises one selected from polyethylene naphthalate, polyethylene terephthalate, polyether sulfone, and polyimide.

21. A method of manufacturing a semiconductor device according to claim 19, wherein the holding frame comprises a ceramics-metal complex.

22. A method of manufacturing a semiconductor device, comprising the steps of:

fixing an outer circumference of a flexible substrate capable of being thermally shrunk to a frame-shaped holding frame;

heating the fixed flexible substrate at a temperature that the flexible substrate is thermal-shrunk, and forming an amorphous semiconductor film on the flexible substrate by a plasma CVD method.

23. A method of manufacturing a semiconductor device according to claim 22, wherein the flexible substrate comprises one selected from polyethylene naphthalate, polyethylene terephthalate, polyether sulfone, and polyimide.

24. A method of manufacturing a semiconductor device according to claim 22, wherein the holding frame comprises a ceramics-metal complex.

25. A method of manufacturing a semiconductor device, comprising the steps of:

fixing a flexible substrate capable of being thermally shrunk to a holding frame;

heating the flexible substrate at a temperature that the flexible substrate is thermal-shrunk; and forming a predetermined pattern over the flexible substrate by screen printing.

26. A method of manufacturing a semiconductor device according to claim 25, wherein the flexible substrate comprises one selected from polyethylene naphthalate, polyethylene terephthalate, polyether sulfone, and polyimide.

27. A method of manufacturing a semiconductor device according to claim 25, wherein the holding frame comprises a ceramics-metal complex.

28. A method of manufacturing a semiconductor device, comprising the steps of:

fixing an outer circumference of a flexible substrate capable of being thermally shrunk to a frame-shaped holding frame;

heating the flexible substrate at a temperature that the flexible substrate is thermal-shrunk, and forming a predetermined pattern over the flexible substrate by laser processing.

29. A method of manufacturing a semiconductor device according to claim 28, wherein the flexible substrate comprises one selected from polyethylene naphthalate, polyethylene terephthalate, polyether sulfone, and polyimide.

30. A method of manufacturing a semiconductor device according to claim 28, wherein the holding frame comprises a ceramics-metal complex.

* * * * *